(12) United States Patent
Scherer et al.

(10) Patent No.: US 8,152,536 B2
(45) Date of Patent: Apr. 10, 2012

(54) CONNECTION DEVICE FOR CONNECTION TO A SOLAR MODULE AND SOLAR MODULE COMPRISING SUCH CONNECTION DEVICE

(75) Inventors: Heinz-Peter Scherer, Bensheim (DE); Guenter Feldmeier, Lorsch (DE); Istvan Novak, Stuttgart (DE)

(73) Assignee: Tyco Electronics Amp GmbH, Bensheim (DE)

( * ) Notice: Subject to any disclaimer, the term of this patent is extended or adjusted under 35 U.S.C. 154(b) by 36 days.

(21) Appl. No.: 12/718,401

(22) Filed: Mar. 5, 2010

(65) Prior Publication Data

US 2010/0233909 A1 Sep. 16, 2010

(30) Foreign Application Priority Data

Mar. 10, 2009 (DE) .......................... 10 2009 012 539

(51) Int. Cl.
*H01R 12/00* (2006.01)
(52) U.S. Cl. ...................................... 439/76.1; 439/828
(58) Field of Classification Search .................. 439/76.1, 439/625, 535
See application file for complete search history.

(56) References Cited

U.S. PATENT DOCUMENTS

| | | | | |
|---|---|---|---|---|
| 4,203,646 A | * | 5/1980 | Desso et al. ................. | 439/724 |
| 4,767,340 A | * | 8/1988 | Hohorst ........................ | 439/729 |
| 4,993,959 A | * | 2/1991 | Randolph ....................... | 439/92 |
| 5,860,837 A | * | 1/1999 | Bock et al. .................... | 439/828 |
| 7,510,448 B2 | * | 3/2009 | Eppe et al. ..................... | 439/835 |
| 7,618,265 B2 | * | 11/2009 | Rueggen et al. ............. | 439/76.1 |
| 2006/0283628 A1 | * | 12/2006 | Feldmeier et al. ............ | 174/260 |
| 2008/0280509 A1 | * | 11/2008 | Ma et al. ....................... | 439/837 |
| 2009/0209115 A1 | * | 8/2009 | Rueggen et al. ............. | 439/76.1 |
| 2009/0215292 A1 | * | 8/2009 | Rueggen et al. ................ | 439/83 |
| 2011/0014824 A1 | * | 1/2011 | Boling et al. ................. | 439/815 |
| 2011/0070765 A1 | * | 3/2011 | Kobayashi .................... | 439/387 |
| 2011/0195585 A1 | * | 8/2011 | Feldmeier et al. ............ | 439/110 |

* cited by examiner

*Primary Examiner* — Renee S Luebke
*Assistant Examiner* — Larisa Tsukerman
(74) *Attorney, Agent, or Firm* — Barley Snyder

(57) ABSTRACT

A connecting device for connecting to an electrical connection system of a solar module includes a connector housing to be arranged on an outer surface of the solar module and also at least one conductor component, which is arranged in the connector housing. At least one connection mechanism is provided with connecting device, and formed for connecting to a conductor, which is led out of the solar module, of the electrical connection system of the solar module. The connection mechanism has at least one resilient contact region, which is embodied for contacting the led-out conductor in a contacting position, the connection mechanism also includes at least one engagement portion, which is embodied for engaging a tool in order to move the resilient contact region out of its contacting position. This allows the connector housing to be attached to the connector housing in a largely automated manner and to be connected to a led-out conductor of the connection system.

14 Claims, 5 Drawing Sheets

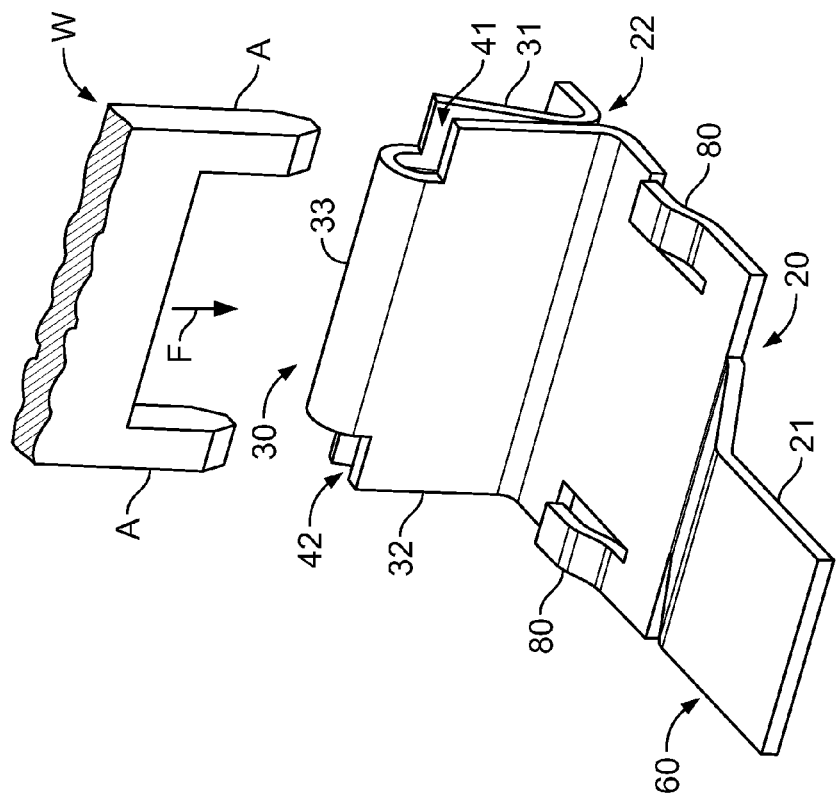
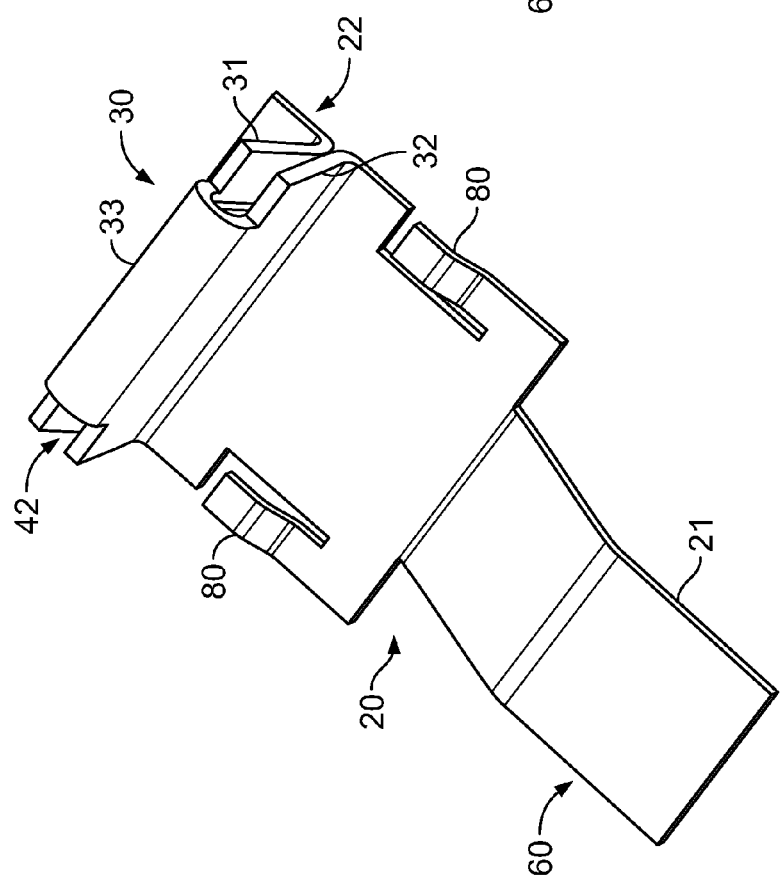

CONNECTION DEVICE FOR CONNECTION TO A SOLAR MODULE AND SOLAR MODULE COMPRISING SUCH CONNECTION DEVICE

CROSS-REFERENCE TO RELATED APPLICATIONS

This application claims the benefit of the filing date under 35 U.S.C. §119(a)-(d) of German Patent Application No. 10 2009 012539.6 filed Mar. 10, 2009.

FIELD OF THE INVENTION

The present invention relates to a connecting device for connection with a solar module, and in particular, a connecting device having at least connection mechanism for connecting an electrical conductor to an electrical connection system of the solar module.

BACKGROUND

In a typical embodiment, a photovoltaic solar module includes a panel-like layered arrangement with solar cells that are arranged between two outer layers and generate electrical energy by a photovoltaic effect. The solar cells are generally arranged between the outer layers in a corresponding intermediate space and are interconnected to one another within the layered arrangement with an electrical connection system. Embodiments of solar modules are in this regard known, in which the electrical connection system of the solar cells is outwardly connected, e.g. to a electrical consumer, at the back, which is remote from the irradiation side, of the solar module by means of electrical conductors, such as connection foils. These connection foils are connected in one or more connecting devices, which are designed, for example, in the form of a connection case or a connection outlet, to one or more electrical conductors of a connection line. For this purpose, a connecting device of this type has one or more conductor components, which are arranged in a connector housing and to which, on the one hand, one or more connection foils of the solar module and, on the other hand, one or more electrical conductors of one or more connection cables are connected.

In addition, a connecting device of this type can contain one or more diodes, which are provided to prevent current flow between solar cells located in sunlight and solar cells located in the shade, since solar cells supply different solar currents and solar voltages. With the aid of what are known as bypass diodes of this type, the module can continue to operate even with partial shading and corresponding reduced power.

The conductor component or components arranged in the connector housing connects to a conductor leading from the solar cell, generally using a connection mechanism. For example, the led-out contact track ends are placed against or around connection contacts of the conductor components that are arranged perpendicularly to the solar module, so that the connection contacts contact the led-out contact track ends on both sides. Spring elements, which are each slid over a corresponding connection contact apply a connection force to the respective contact track to form an electrical connection.

A drawback of the described connection outlet arrangement arises, in that the spring elements have to be slid over the contact track ends or connection foils, and during the process, the contact track ends can become displaced until the respective spring element has reached its final position. This results substantially from the fact that the respective spring element is moved along the contact track while exerting contacting pressure, as a result of which the contact track can become displaced. Furthermore, a drawback consists in the fact that assembly is relatively complex, as the contact track ends must firstly be placed around a corresponding connection contact and be held in this position so that the spring element can be slid over a contact track end.

SUMMARY

It is therefore an object of the invention to provide an improved connecting device. In particular, a connecting device that is comparatively simple in design, and at the same time able to provide high contact security.

The connecting device is designed for connecting to an electrical connection system of a solar module and includes a connector housing, a connection mechanism, and an engagement portion. The connector housing is arranged on an outer surface of the solar module, while the connection mechanism is arranged in the connector housing and connectable to a conductor led out of the solar module. The connection mechanism includes at least one resilient contact region for contacting the led-out conductor. The engagement portion is located on the connection mechanism and is for engaging a tool that moves the resilient contact region.

BRIEF DESCRIPTION OF THE DRAWINGS

The invention will be explained in greater detail in the following with reference to embodiments, referring to the appended drawings, in which:

FIG. 4-6 are perspective views of a conductor component in the form of a bus bar with a connection mechanism formed thereon according to another embodiment of the invention.

DETAILED DESCRIPTION OF THE EMBODIMENT(S)

The invention will now be described in greater detail with reference to the drawings.

Figure 1:
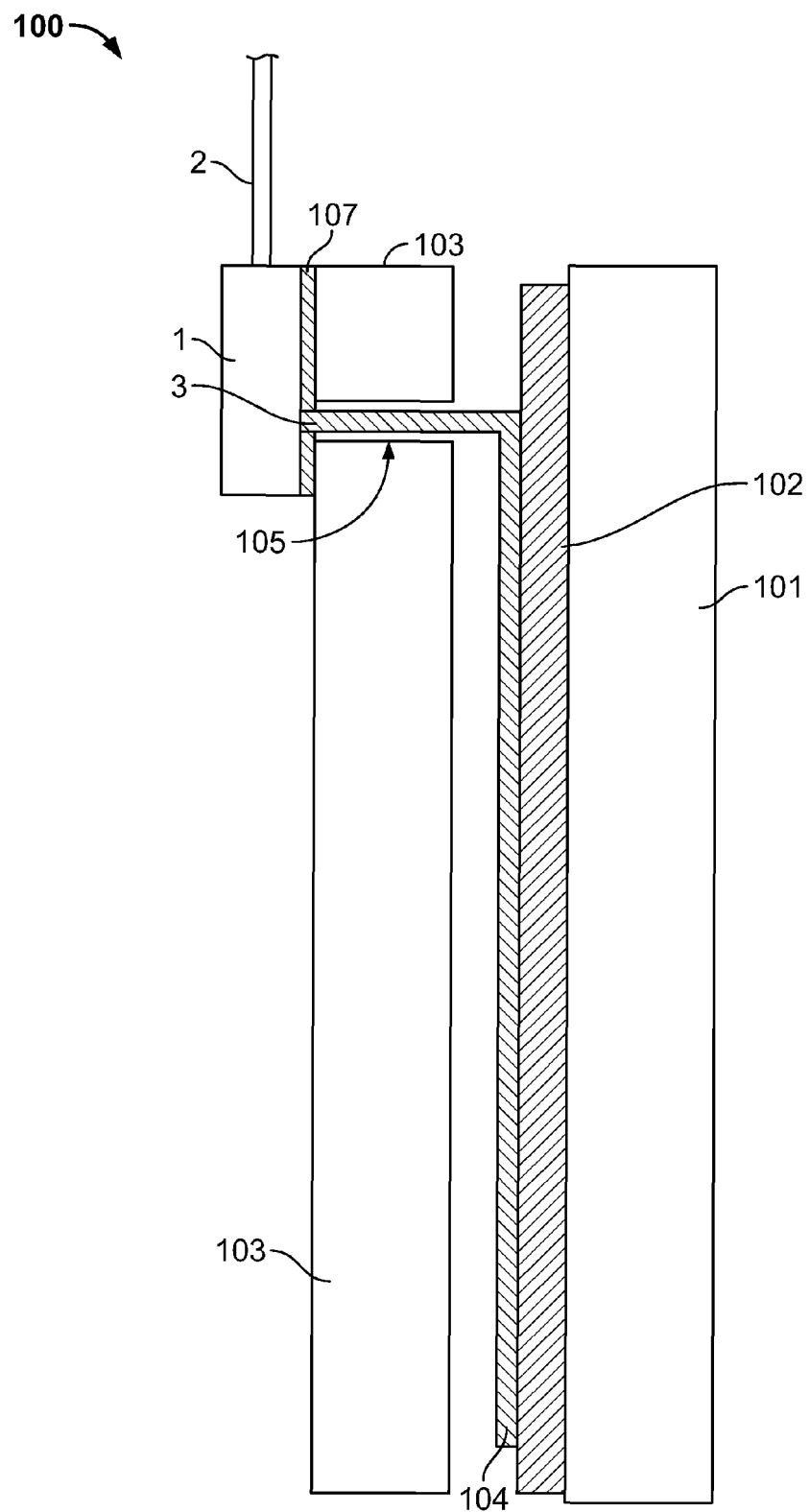
FIG. 1 is a cross-sectional view of an exemplary photovoltaic solar module connected to a connecting device according to the invention.

FIG. 1 is a cross-sectional illustration (not true to scale) of a photovoltaic solar module 100 provided with a connecting device 1 in the form of a connection outlet or a connection box. The solar module 100 includes a layered arrangement with a sheet-like, irradiation-side first layer 101 which can be designed in the form of a glass plate or a foil-like layer. Furthermore, the solar module 100 includes a sheet-like second layer 103 which is opposite from the irradiation side and can also be embodied in the form of a glass plate or a foil-like layer. In the present embodiment, the layers 101 and 103 are designed as respective glass plates. Located between the two layers 101 and 103 is at least one solar cell 102 or an arrangement made up of a plurality of solar cells 102 which, when irradiated with light, supply electrical energy based on a photovoltaic effect. The solar cell(s) 102 is/are connected to an electrical connection system 104. The electrical connection system 104 is indicated merely schematically in FIG. 1 and serves in particular to electrically interconnect the solar cell(s) and to connect them to the outside world. The electrical connection system 104 includes, for example, a copper foil which, on the one hand, is electrically contacted with the back of the solar cell(s) 102 and, on the other hand, merges with one or more conductors 3 of the solar module 100 or is connected to at least one conductor 3 of the solar module 100, which is designed, for example, in the form of a connection foil or a connection strip and is led out of the solar module 100. The electrical connection system 104 of the solar module 100 can be connected to an external connection line 2, for example in the form of a solar connection cable, using one or more foil conductors 3 of this type.

As is also illustrated in FIG. 1, a connecting device 1 is fastened to the back of the layer 103, which forms an outer surface of the solar module 100, as will be described hereinafter in greater detail, for example by adhesive bonding by means of adhesive 107. Furthermore, the layer 103 has a receiving passageway 105 through which the electrical conductor 3, for example, in the form of a foil conductor, can be led to the connecting device 1.

Figure 2:
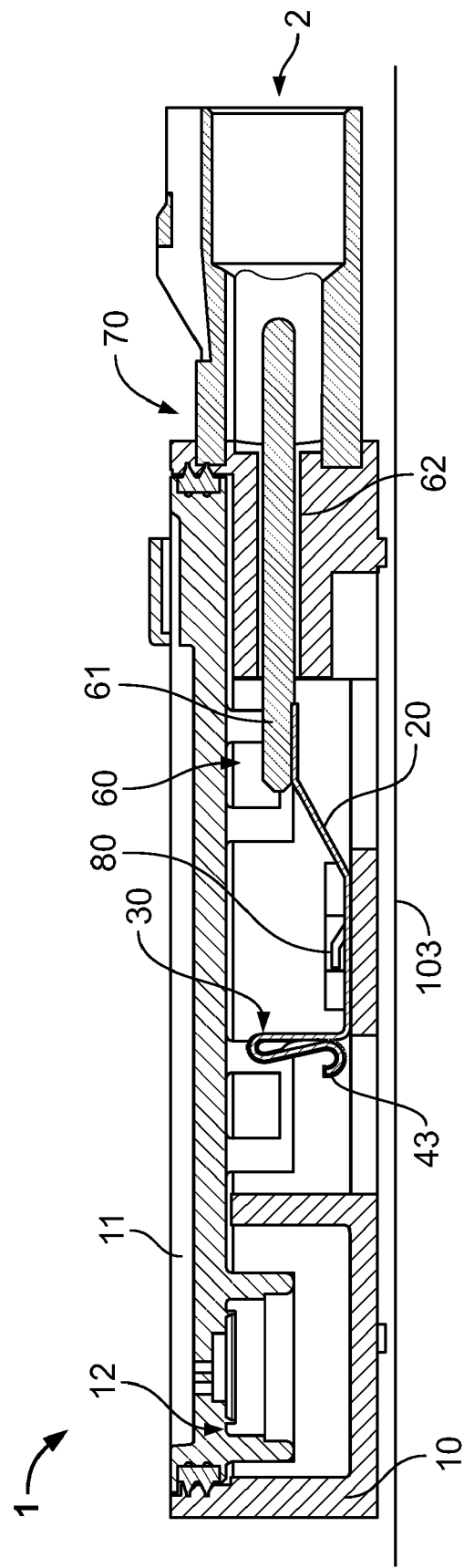
FIG. 2 is a cross-sectional view of a connector housing with a conductor component arranged therein and a connection mechanism formed onto the conductor component according to a first embodiment of the invention.
Figure 3:
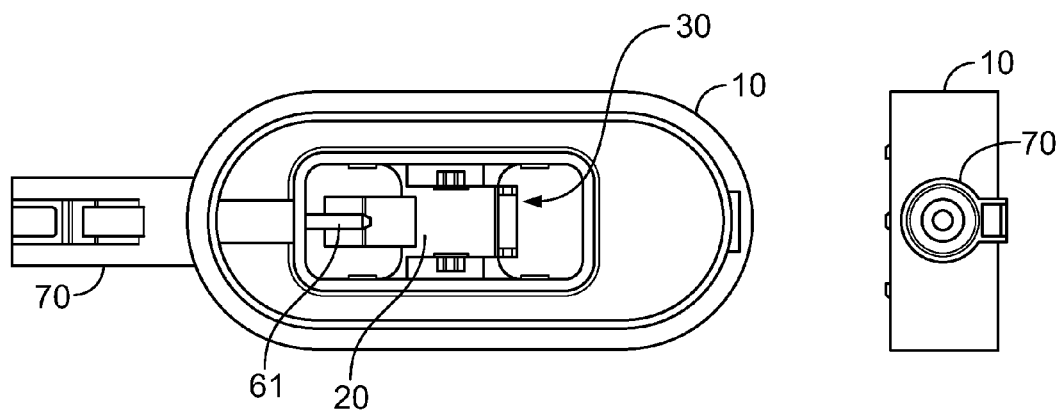
FIG. 3 is a plan view and a side view of the connector housing according to FIG. 2.

FIGS. 2 and 3 show an embodiment of a connector housing 10 with components arranged therein, which can be used for a connecting device 1. For example, in the embodiment shown, the connector housing 10 includes an exemplary conductor component 20, which is arranged therein and is designed in the form of a bus bar (see FIGS. 4-6 for more detail). The composition and mode of operation of the individual components illustrated in FIGS. 2 to 7 will be described hereinafter in greater detail.

Figure 7:
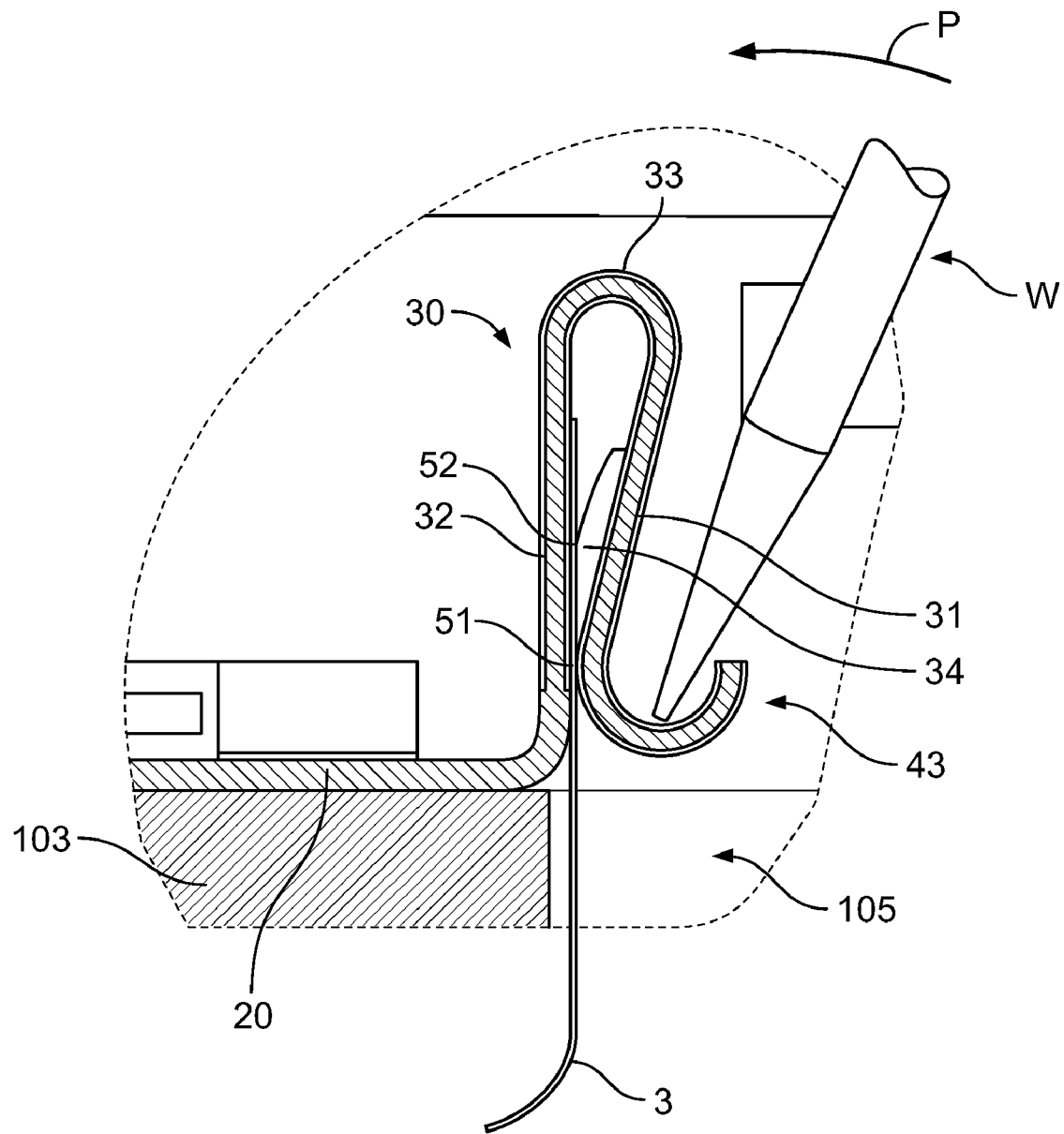
FIG. 7 is a schematic cross-sectional view of a bus bar which is positioned on a solar module and has a formed-on connection mechanism according to the embodiment shown in FIG. 2.

As is illustrated in greater detail in FIGS. 2 and 7, viewed in conjunction with each other, a conductor 3 is led out of the solar module in a roughly vertical direction through the receiving passageway 105 of the layer 103 in order to contact a connection mechanism 30. The conductor 3 is designed, for example, as a foil conductor. In the present embodiment, the connection mechanism 30 is embodied as a curved spring contact and has an attachment region 32 which is formed onto the conductor component 20 (i.e. bus bar) and merges with a resilient contact region 31 via a curved connecting region 33.

The attachment region 32 formed onto the conductor component 20 (i.e. bus bar) prepares a mating contact region opposing the resilient contact region 31. In this case, the resilient contact region 31, in the contacting position, as illustrated in FIG. 7, presses the conductor 3 against the mating contact region (i.e. attachment region 32 formed onto the conductor component 20). In the contacting position, contacting is provided in particular at the contact point or the contacting surface 51 at which the leg forming the contact region 31 presses against the opposing mating contact region the mating contact region (i.e. attachment region 32 formed onto the conductor component 20) of the connection mechanism 30. In the embodiment shown, the mating contact region (i.e. attachment region 32 formed onto the conductor component 20) is formed onto the conductor component 20 (i.e. bus bar), roughly perpendicularly to the conductor component 20 (i.e. bus bar). FIG. 7 shows in this regard that the resilient contact region 31 and the connecting region 33 jointly form in cross section roughly an S shape or Z shape. As a result, it is possible for the foil conductor 3 to be inserted into the intermediate space thus formed between the legs of the connection mechanism 30. In order to increase the contact security, the resilient contact region 31 can have one or more bulges or beads 34 in order to form one or more additional contact points 52 or contacting surfaces with the foil conductor 3.

According to the embodiment shown in FIGS. 2 and 3, the connector housing 10 is provided with only one conductor component 20 (i.e. bus bar), the design type and arrangement of which are to be regarded as being merely exemplary and can also vary as required. Furthermore, the number of conductor components 20 (i.e. bus bar) used can also vary as required.

On a first side 21 of the conductor component 20 (i.e. bus bar), a connection region 60 is provided for connecting to at least one electrical conductor, such as a contact 61. The contact 61 can for example be designed as a contact, in particular a contact pin, which is welded or otherwise connected to the conductor component 20 (i.e. bus bar) in the connection region 60. It goes without saying that the contact 61 itself can also be welded-on directly. On a second side 22, opposing the first side 21, of the conductor component 20 (i.e. bus bar), the connection mechanism 30 is provided in the form of a curved spring contact, as described in greater detail hereinbefore.

In the connection region 60, the conductor component 20 (i.e. bus bar) can be connected to one or more conductors of a connection cable 2 using the contact 61. However, the connection cable 2 is not illustrated in great detail in FIG. 2. The contact 61 forms for this purpose on a side remote from the conductor component 20 (i.e. bus bar) a part of a plug-in connection device 70 to which the connection cable 2 can be connected, e.g. using a suitable corresponding plug connector. The contact 61 is secured in the contact passageway 62 of the connector housing 10 and forms on sides of the plug-in connection device 70 a pin contact, which can be connected to a corresponding socket contact on sides of the connection cable 2. In principle, various type of contacting options are possible in this connection.

The conductor component 20 (i.e. bus bar) is for example interlocked or otherwise fastened to a corresponding locking element in the connector housing 10. For this purpose, the conductor component 20 (i.e. bus bar) has in a region, located between the first side 21 and second side 22, at least one fastening portion 80 that is provided to fix the conductor component 20 (i.e. bus bar) in the connector housing 10. The fastening portion 80 has e.g. one or more interlocking arms (shown in FIGS. 4-6), which engage with a corresponding mating interlocking mechanism attached to the housing bottom of the connector housing, as indicated in FIG. 2. The connector housing 10 is closed by a housing cover 11 and can be aerated or de-aerated using an aeration mechanism 12.

In addition to the aforementioned connection regions for contacting a conductor 3 and a connection cable 2, the conductor component 20 (i.e. bus bar) can also have a contact region, which is provided for contacting a diode component, in particular in an embodiment in which a plurality of the conductor components 20 (i.e. bus bars) are arranged in the connector housing 10. A diode component of this type can in particular perform the function of what is commonly known as a bypass diode.

FIGS. 2 and 7 show the connection mechanism 30 according to the first embodiment, the contact region 31 being shown in its contacting position. In this first embodiment, the free end of the contact region 31 is embodied as a channel-like bend. This channel-like bend forms the engagement portion 43. For contacting the conductor 3, a tool W is inserted into the engagement portion 43 and subsequently moved in the direction of the arrow P. As a result, the contact region 31 is moved out of the contacting position, thus creating a gap between the contact region 31 and the mating contact region (i.e. attachment region 32 formed onto the conductor component 20). The conductor 3 is inserted into the gap 42 and the tool W is afterwards led out of the engagement portion 43, as a result of which the contact region 31 presses the conductor 3 toward the mating contact region (i.e. attachment region 32 formed onto the conductor component 20).

Alternatively, the engagement portion 41 can be embodied, instead of at the free end of the contact region 31, adjacent to the connecting region 33. This other embodiment will be described hereinafter in greater detail with reference to FIGS. 4 to 6.

Figure 4:
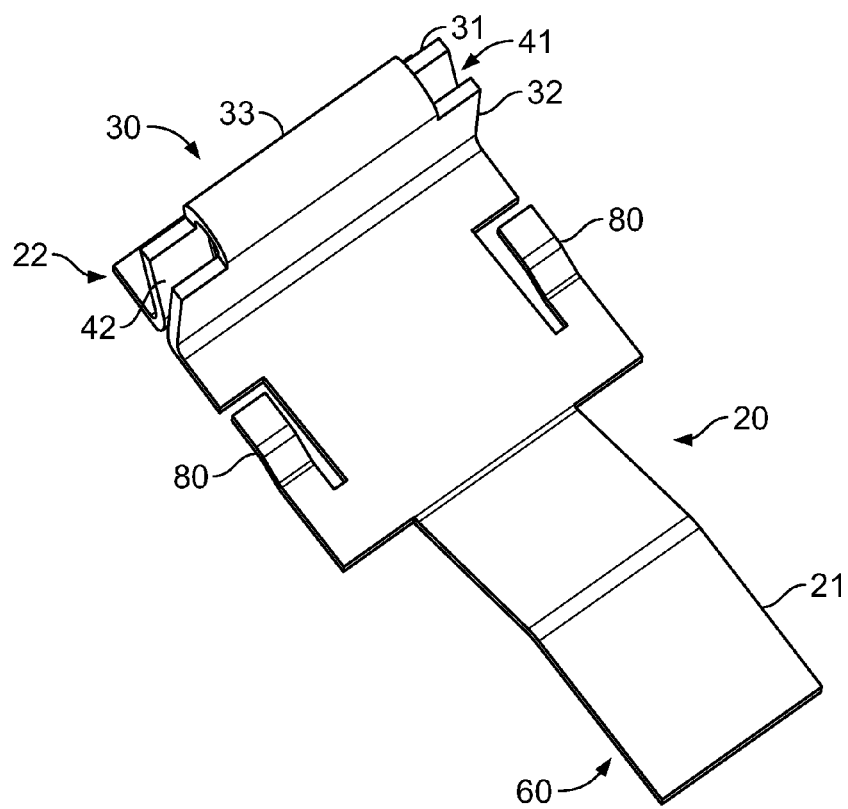

FIG. 4 shows that the width of the connecting region 33 is less than the respective width of the contact region 31 and the mating contact region (i.e. attachment region 32 formed onto the conductor component 20). As the transverse axis of the connecting region 33 is fixed in such a way that said transverse axis is aligned with the longitudinal axes of the contact region 31 and that of the mating contact region (i.e. attachment region 32 formed onto the conductor component 20), a gap 42, which can be accessed from above, is formed on both sides of the connecting region 33. The gap 42 and the opposing gap thus jointly form the engagement portion 41 according to this alternative embodiment. As shown in FIG. 6, the arms A of a tool W are inserted into the respective gap 42 as a result of movement of the tool W in the direction F. The resilient contact region 31 is moved out of its contacting position as a result of the insertion of the arms A. In particular, this movement out of the contacting position is achieved as a result of the insertion of the tool W in the direction F, i.e. a subsequent pivoting movement of the tool W, as in the embodiment shown in FIGS. 2 and 7, is not required here. The thicknesses of the arms A determine how far the contact region 31 is moved away from the mating contact region (i.e. attachment region 32 formed onto the conductor component 20).

In both embodiments of the engagement portion 41, the foil conductor 3 is thus inserted in a contactless manner. The positioning movement and the insertion and withdrawal of the tool W can, for example, be carried out in a fully automatic manner and in one operation with the aid of the same mounting device.

Thus, in the positioning movement of the connector housing 10, the connection mechanism 30 can in this case be moved along without contact, partly on the led-out conductor 3. After the positioning and adhesive bonding of the housing bottom to the solar module 100 and the closing with the housing cover 11, the components provided in the connector housing 10 are protected from environmental influences. At the same time, secure contacting of the connection mechanism 30 on the led-out conductor 3 is ensured.

The electrical connection region in the region of the connection mechanism 30 is easily accessible. In particular, led-out connection foils can be contacted very easily, as the housing-side connection region is very readily accessible. Afterwards, in a positioning movement, the connector housing 10 can be positioned so as to produce a tight seal and the contacting can be established in the process. As a result of the pre-opening of the connection mechanism 30 during positioning of the connector housing 10, the corresponding connection foil is not loaded and displaced by spring contact 61 forces and does not have to be supported with the aid of separate abutment surfaces either.

The connecting device 1, according to the invention, offers the advantage that the connector housing 10 can be attached to the solar module 100 in a largely automated manner and can be connected to led-out conductors 3 of the connection system 104 of the solar module 100.

According to the invention, the connection mechanism 30 is embodied in such a way that the conductor component 20 can be connected in one operation to a conductor 3, which is led out of the solar module 100. This is achieved, in particular, in that the connection mechanism 30 is formed onto the conductor component 20 and can be moved out of its contacting position with the aid of a tool W by engaging with the engagement portion 41 of the resilient contact region 31 when the conductor component 20 is connected to the led-out conductor 3. This eliminates the need for a separate spring element. Furthermore, the engagement portion 41 allows the connection mechanism 30 to establish the led-out conductor 3 to move before contacting pressure is exerted by the connection mechanism 30. For example, a tool W may move the resilient contact region 31 out of its contacting position during the attachment of the connector housing 10 to the solar module 100. Accordingly, the resilient contact region 31 can be led past the led-out conductor 3 before it makes contacts the conductor 3 in the contacting position. According to the invention, a displacement of the led-out conductor 3 of the solar module 100 is thus effectively prevented during the course of the contacting with the connecting device 1. In this way, it is no longer necessary to stabilise the led-out conductor 3 in a separate operating step by abutting it against an abutment surface.

The connection device 1, according to the invention, has proven particularly advantageous if the led-out conductor 3 is designed as a connection foil, e.g. the form of a flat strip, having comparatively low rigidity. The lower inherent rigidity presents the risk of the connection foil being displaced comparatively easily during contacting with a contact 61 of the connecting device 1. This risk is averted in that the engagement portion 41 allows the resilient contact region 31 to be moved out of its contacting position, advantageously in the same operation during the attachment of the connector housing 10 to the solar module 100.

The engagement portion 41 provided can in principle be any type of device which is suitable for interacting with a corresponding tool 44 in order to move the resilient contact region 31 out of its contacting position. For example, the engagement portion 41 provided is an opening, a slot, a gap 42 or a projection with which a tool W, e.g. in the form of a lever or the like, can engage and act. Generally, it is possible to provide any type of engagement portion 41, which forms a working surface for a tool W in order to move the resilient contact region 31 out of its contacting position, i.e. to open it.

In an alternative embodiment, the engagement portion 41 can be embodied based on a channel-like bend at the free end of the contact region 31. In this case, a tool W can be inserted into the depression formed by the bend. However, in this embodiment, a pivoting movement of the tool W is required to open the contact region 31.

According to another embodiment, the engagement portion 41 is provided adjacent to the connecting region 33. In this embodiment, the width of the connecting region 33 is less than the width of the contact region 31 and attachment region 32 such that there is formed at both sides of the connecting region 33 a gap 42 which can be accessed from above and with which a corresponding tool W can engage. Accordingly, the tool W engages between the resilient contact region 31 and the opposing attachment region 32 of the connection mechanism 30 in order to move them apart. In this exemplary embodiment, merely the thickness of the tool W causes the movement, i.e. a pivoting movement of the tool W is conceivable, but not required.

Besides these, the configurations described in the above-described embodiment can be selected optionally or can be changed appropriately in to other configurations without departing from the spirit and scope of the present invention.

The invention claimed is:

1. A connecting device for connecting to an electrical connection system of a solar module, comprising:
   a connector housing arranged on an outer surface of the solar module;
   a connection mechanism being arranged in the connector housing and having at least one resilient contact region for contacting a conductor of the solar module and a mating contact region opposing the resilient contact region, each having a width which is greater than a width of a connecting region which connects the mating contact region and the resilient contact region to each other; and
   an engagement portion located on the connection mechanism and engageable with a tool to urge the connection mechanism in the resilient contact region.

2. The connecting device according to claim 1, wherein the resilient contact region and the mating contact region are configured to apply a corresponding contacting force on the conductor.

3. The connecting device according to claim 2, wherein the engagement portion is configured in such a way that the resilient contact region is moveable away from the mating contact region by engaging the tool.

4. The connecting device according to claim 2, wherein the resilient contact region includes at least one bulge or bead forming a contact point with the conductor.

5. The connecting device according to claim 1, wherein the connecting region is a curved connecting region and the connection mechanism is formed as a curved spring contact.

6. The connecting device according to claim 1, wherein the engagement portion is located adjacent to the connecting region.

7. The connecting device according to claim 1, wherein the engagement portion is located in a gap formed by the resilient contact region and the mating contact region.

8. The connecting device according to claim 7, wherein the gap is formed on both sides of the connecting region.

9. The connecting device according to claim 1, wherein the engagement portion is positioned at a free end of the resilient contact region.

10. The connecting device according to claim 9, wherein the engagement portion is formed as a channel-like bend.

11. The connecting device according to claim 1, wherein the connection mechanism is formed onto at least one conductor component arranged in the connector housing.

12. The connecting device according to claim 11, wherein the conductor component is a bus bar having a connection region provided on a first side for connecting to at least one contact and the connection mechanism is provided on a second side opposite the first side.

13. The connecting device according to claim 12, wherein the bus bar connects to the at least one contact forming a part of a plug-in connection device to which the conductor can be connected.

14. The connecting device according to claim 12, further comprising at least one fastening portion of the conductor component positioned between the connection region and the connection mechanism, the at least one fastening portion securing the conductor component in the connector housing.

* * * * *